(12) United States Patent
Miyasaka et al.

(10) Patent No.: US 8,884,167 B2
(45) Date of Patent: Nov. 11, 2014

(54) PRINTED CIRCUIT BOARD UNIT

(75) Inventors: Kazuya Miyasaka, Nagano (JP); Kouji Kobayashi, Nagano (JP); Akihito Fukuzawa, Allentown, PA (US)

(73) Assignee: Shinano Kenshi Co., Ltd., Nagano (JP)

( * ) Notice: Subject to any disclaimer, the term of this patent is extended or adjusted under 35 U.S.C. 154(b) by 165 days.

(21) Appl. No.: 13/346,085

(22) Filed: Jan. 9, 2012

(65) Prior Publication Data

US 2012/0181077 A1 Jul. 19, 2012

(30) Foreign Application Priority Data

Jan. 17, 2011 (JP) ................. 2011-007337

(51) Int. Cl.
*H05K 1/11* (2006.01)
*H05K 3/34* (2006.01)

(52) U.S. Cl.
CPC ...... *H05K 3/3447* (2013.01); *H05K 2201/1084* (2013.01); *H05K 2201/10295* (2013.01); *H05K 2201/10818* (2013.01); *H05K 2201/10787* (2013.01)
USPC .......................................................... 174/267

(58) Field of Classification Search
CPC .......... H05K 1/11; H05K 2201/10303; H05K 2201/10984; H05K 1/84; H01R 12/58
USPC .......................................................... 174/267
See application file for complete search history.

(56) References Cited

U.S. PATENT DOCUMENTS

2001/0044238 A1 * 11/2001 Gugliotti et al. .............. 439/668
2002/0047504 A1    4/2002 Takahashi

FOREIGN PATENT DOCUMENTS

| JP | U-05-055596 | | 7/1993 | |
| JP | 2000231945 A | * | 8/2000 | ............... H01R 4/02 |
| JP | A-2000-231945 | | 8/2000 | |
| JP | 2002057431 A | * | 2/2002 | ............... H05K 1/18 |
| JP | 2010130723 A | * | 6/2010 | ............... H02K 3/50 |
| JP | A-2010-130723 | | 6/2010 | |

OTHER PUBLICATIONS

Office Action issued in Japanese Application No. 2011-007337 dated Jan. 8, 2013 (with translation).
Jan. 2, 2014 Office Action issued in Chinese Application No. 201210012946.0 (with translation).

* cited by examiner

*Primary Examiner* — Timothy Thompson
*Assistant Examiner* — Charles Pizzuto
(74) *Attorney, Agent, or Firm* — Oliff PLC (57) ABSTRACT

A printed circuit board unit includes: a printed circuit board including a through hole including first and second inner surfaces opposite to each other; a terminal pin including an insertion portion inserted into the through hole; solder filled into the through hole, and joining the printed circuit board with the terminal pin, wherein the insertion portion includes a base portion abutting the first inner surface, and a protruding portion including: a projection surface projecting from the base portion to the second inner surface and abutting the second inner surface; and a recess surface located at a rear side of the projection surface and spaced apart from the first inner surface, and a length of the protruding portion in a thickness direction of the printed circuit board is greater than a thickness of the printed circuit board.

2 Claims, 10 Drawing Sheets

PRINTED CIRCUIT BOARD UNIT

CROSS-REFERENCE TO RELATED APPLICATION

This application is based upon and claims the benefit of priority of the prior Japanese Patent Application No. 2011-007337, filed on Jan. 17, 2011, the entire contents of which are incorporated herein by reference.

BACKGROUND (i) Technical Field

The present invention relates to a printed circuit board unit.

(ii) Related Art

Japanese Patent Application Publication No. 2010-130723 discloses a technique where a terminal pin is inserted into a through hole of the printed circuit board to join both of the terminal pin and the printed circuit board by soldering. The terminal pin is formed with a protruding portion to be inserted into the through hole, in order to stand the terminal pin inserted into the through hole before being jointed to the printed circuit board by soldering.

However, the molten solder may not be sufficiently filled around the protruding portion depending on the shape of the protruding portion. Thus, the solder may be solidified with containing a bubble near the protruding portion. In such a case where the solder is solidified with containing the bubble near the protruding portion, the solder may be cracked by vibration or the like. Further, this may influence the conductivity between the terminal pin and a pattern of the printed circuit board.

SUMMARY

It is therefore an object of the present invention to provide a printed circuit board unit that suppresses a bubble from remaining in solder joining the terminal pin to a printed circuit board.

A printed circuit board unit includes: a printed circuit board including a through hole including first and second inner surfaces opposite to each other; a terminal pin including an insertion portion inserted into the through hole; solder filled into the through hole, and joining the printed circuit board with the terminal pin, wherein the insertion portion includes a base portion abutting the first inner surface, and a protruding portion including: a projection surface projecting from the base portion to the second inner surface and abutting the second inner surface; and a recess surface located at a rear side of the projection surface and spaced apart from the first inner surface, and a length of the protruding portion in a thickness direction of the printed circuit board is greater than a thickness of the printed circuit board.

The length of the protruding portion in the thickness direction of the printed circuit board is greater than the thickness of the printed circuit board, thereby ensuring a clearance between the recess surface of the protruding portion and the first inner surface of the through hole. Therefore, the molten solder is sufficiently filled into the through hole through the clearance between the recess surface of the protruding portion and the first inner surface of the through hole, when the printed circuit board is joined with the terminal pin by soldering. This suppresses a bubble from being retained in the solder filled into the through hole.

DETAILED DESCRIPTION

Figure 1:
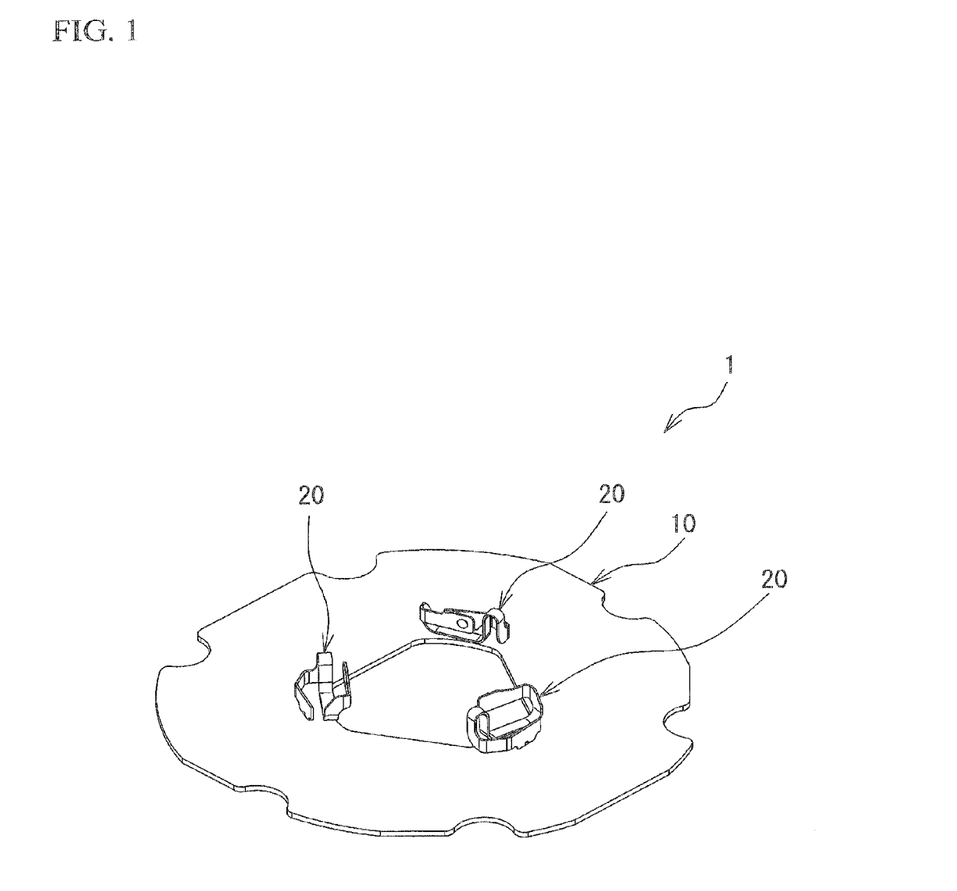
FIG. 1 is a perspective view of a printed circuit board unit of the present embodiment.

FIG. 1 is a perspective view of a printed circuit board unit 1 of the present embodiment. The printed circuit board unit 1 includes: a printed circuit board 10; and plural terminal pins 20 mounted on the printed circuit board 10. The terminal pin 20 is made of metal having a conductivity. The terminal pin 20 is inserted into a through hole 14 formed in the printed circuit board 10 as will be described later, and is joined to the printed circuit board 10 by solder S. Therefore, a pattern of the printed circuit board 10 and the terminal pin 20 are electrically connected to each other. The printed circuit board unit 1 is used for supplying a motor not illustrated with electricity. Specifically, a coil for excitation of the motor is connected to the terminal pin 20. Thus, an energized state of the coil for excitation is switched. Additionally, the application of the printed circuit board unit 1 is not limited to such a motor.

Figure 2:
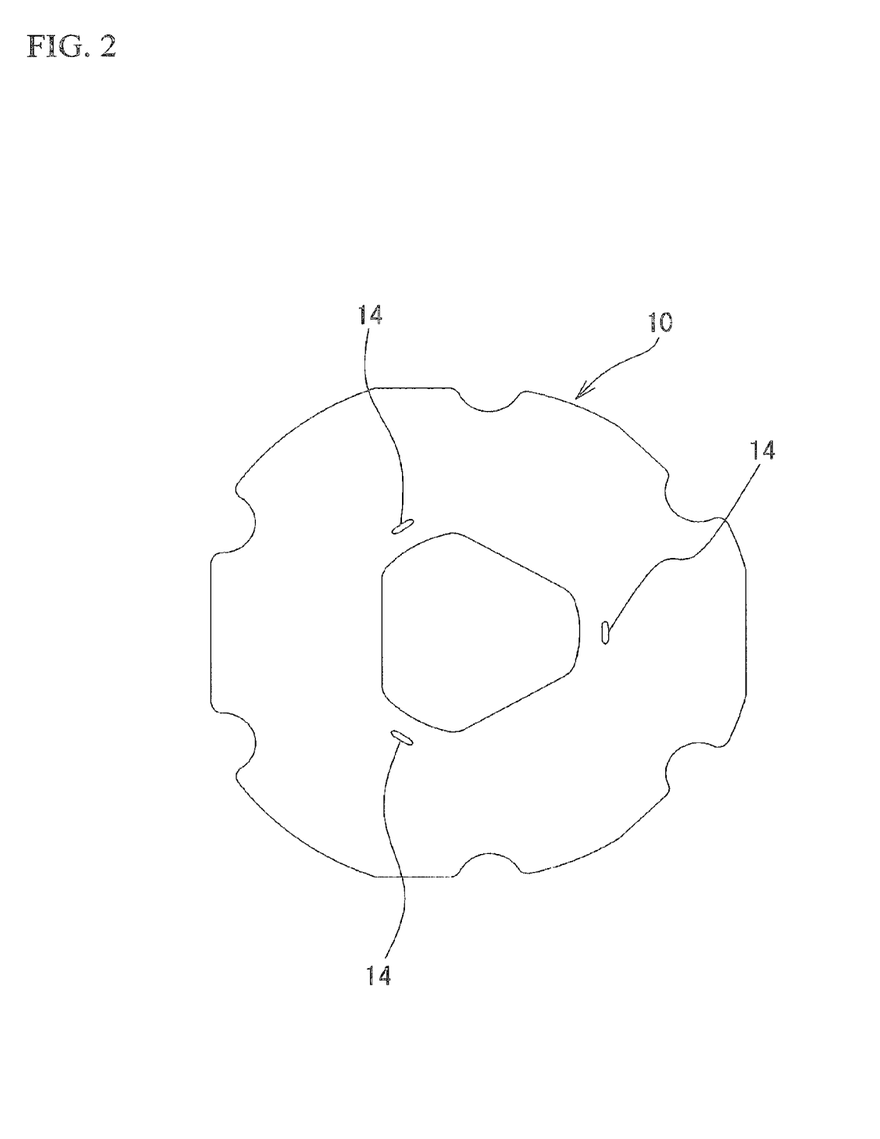
FIG. 2 is a view of a printed circuit board before a terminal pin is not mounted thereon.

FIG. 2 is a view of the printed circuit board 10 before the terminal pin 20 is mounted thereon. The printed circuit board 10 is provided with three through holes 14 as mentioned above. The through hole 14 has an oblong shape. The number of the through hole 14 is not limited to three.

Figure 3A:
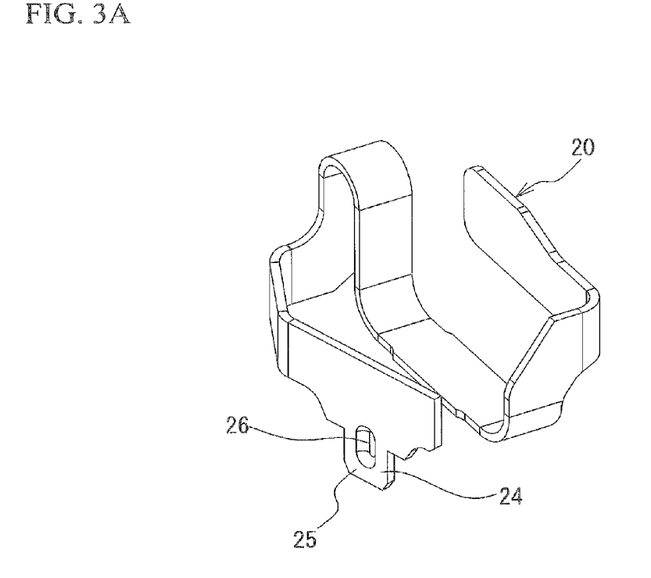
FIGS. 3A and 3B are external views of the terminal pin.
Figure 3B:
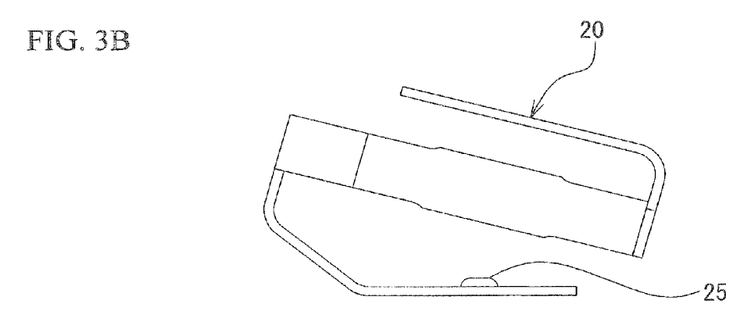
Figure 4A:
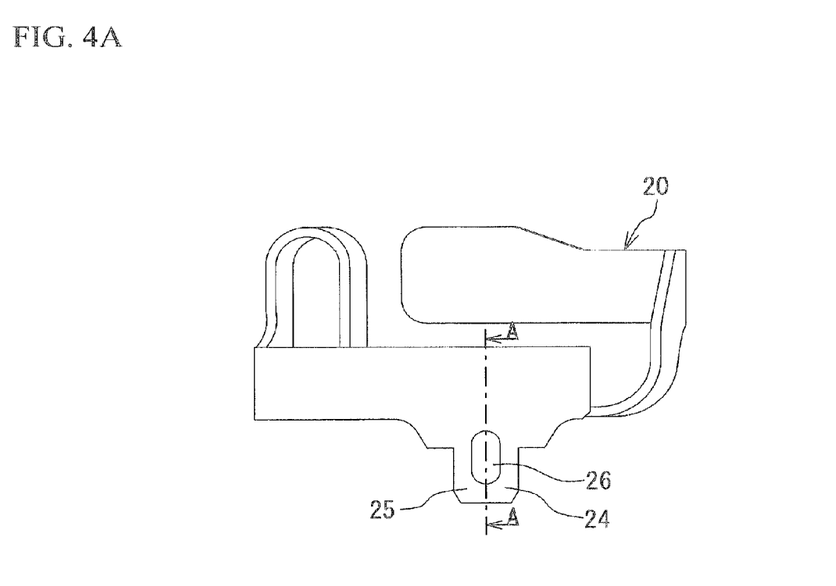
FIG. 4A is an external view of the terminal pin.
Figure 4B:
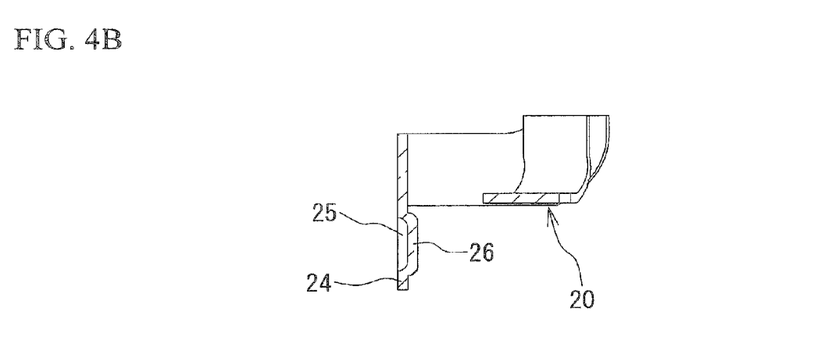
FIG. 4B is a sectional view taken along line A-A of FIG. 4A.

FIGS. 3A and 3B are external views of the terminal pin 20. The terminal pin 20 is formed by bending a single conductive member having a thin plate shape. FIG. 4A is an external view of the terminal pin 20, and FIG. 4B is a sectional view taken along line A-A of FIG. 4A.

The terminal pin 20 is provided at its one end with an insertion portion 24 inserted into the through hole 14. The insertion portion 24 includes a base portion 25, and a protruding portion 26 protruding from the base portion 25. The protruding portion 26 has a protruding shape when viewed from one side of the base portion 25. The protruding portion 26 has a recess shape when viewed from the opposite side of the base portion 25. The base portion 25 has a substantially flat shape, but is not limited to such a shape. The protruding portion 26 is formed into a longitudinally long shape. The insertion portion 24 is formed with the protruding portion 26.

Thus, the terminal pin 20 maintains its upright posture on the printed circuit board 10 with the insertion portion 24 of the terminal pin 20 inserted into the through hole 14 of the printed circuit board 10, without inclining the terminal pin 20 relative thereto, as will be described later in detail. Additionally, the shape of the terminal pin 20 itself is not limited to such a shape, and may have a substantially flat plate shape.

Herein, a brief description will be given of an example of a method of mounting the terminal pin 20 on the printed circuit board 10. Solder paste is beforehand applied around the through hole 14 of the printed circuit board 10. Next, the insertion portion 24 of the terminal pin 20 is inserted into the through hole 14 of the printed circuit board 10, so that the terminal pin 20 is assembled into the printed circuit board 10. Next, the printed circuit board 10 is arranged in a reflow furnace to melt the solder. After that, the printed circuit board 10 is taken out from the reflow furnace to solidify the solder. Therefore, the printed circuit board 10 and the terminal pin 20 are joined to each other by soldering. Additionally, the method of mounting the terminal pin 20 on the printed circuit board 10 is not limited to such a method. For example, a lower surface of the printed circuit board 10 may be dipped in a solder bath with the terminal pin 20 assembled into the printed circuit board 10 so as to join them.

Figure 5:
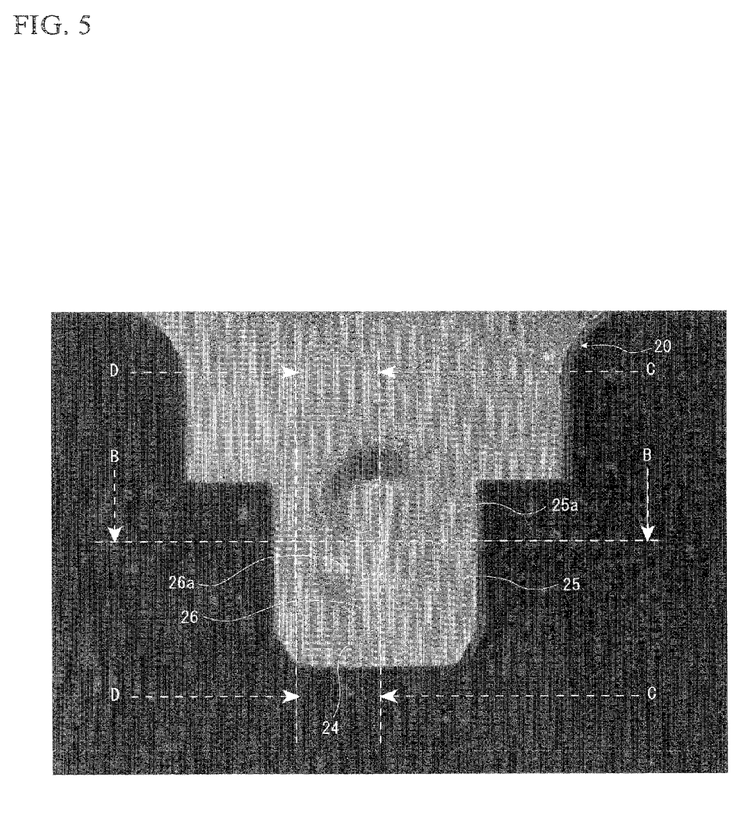
FIG. 5 is an enlarged photograph of an insertion portion of the terminal pin.
Figure 6:
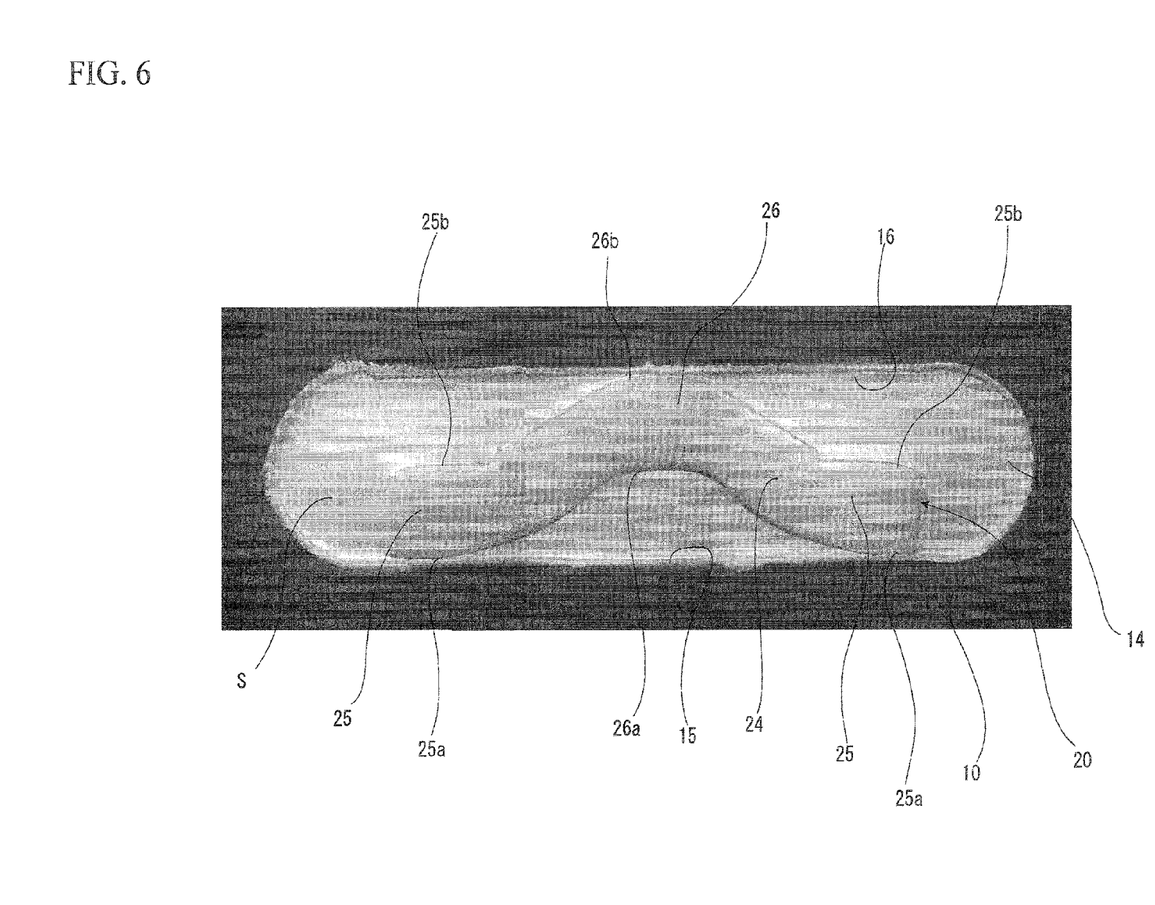
FIG. 6 is a photograph corresponding to a sectional view taken along line B-B of FIG. 5 in a state where both the printed circuit board and the terminal pin are joined to each other by soldering with the insertion portion of the terminal pin inserted into a through hole of the printed circuit board.
Figure 7:
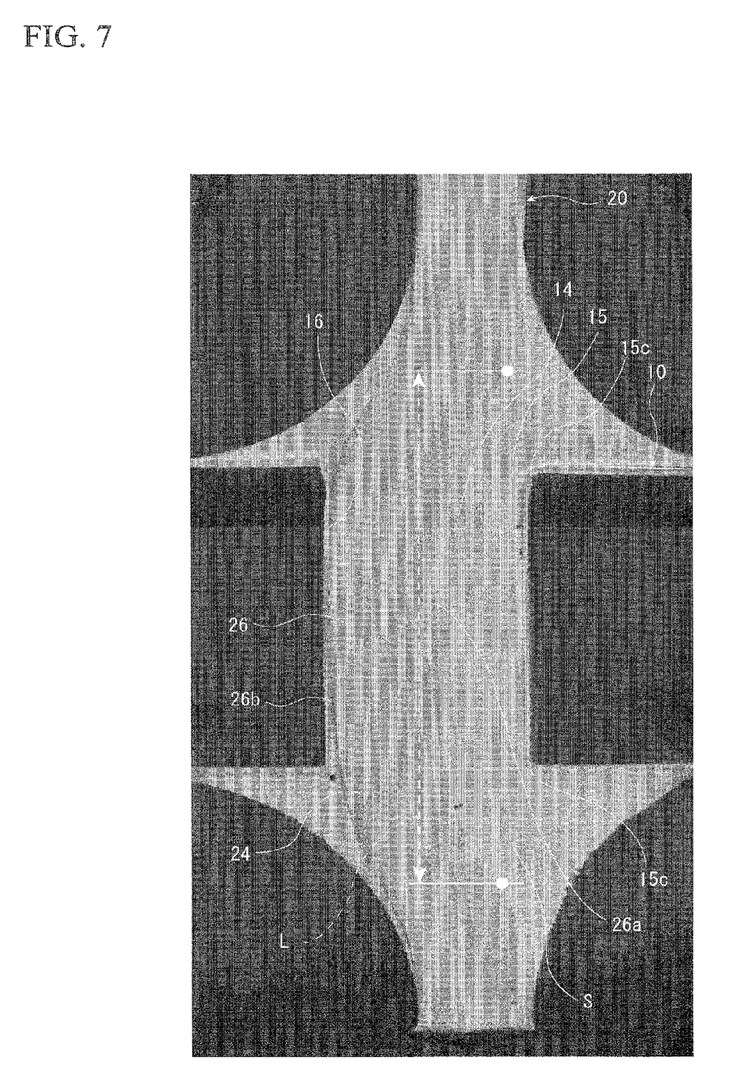
FIG. 7 is a photograph corresponding to a sectional view taken along line C-C of FIG. 5 in the state where both the printed circuit board and the terminal pin are joined to each other by soldering with the insertion portion of the terminal pin inserted into the through hole of the printed circuit board.
Figure 8:
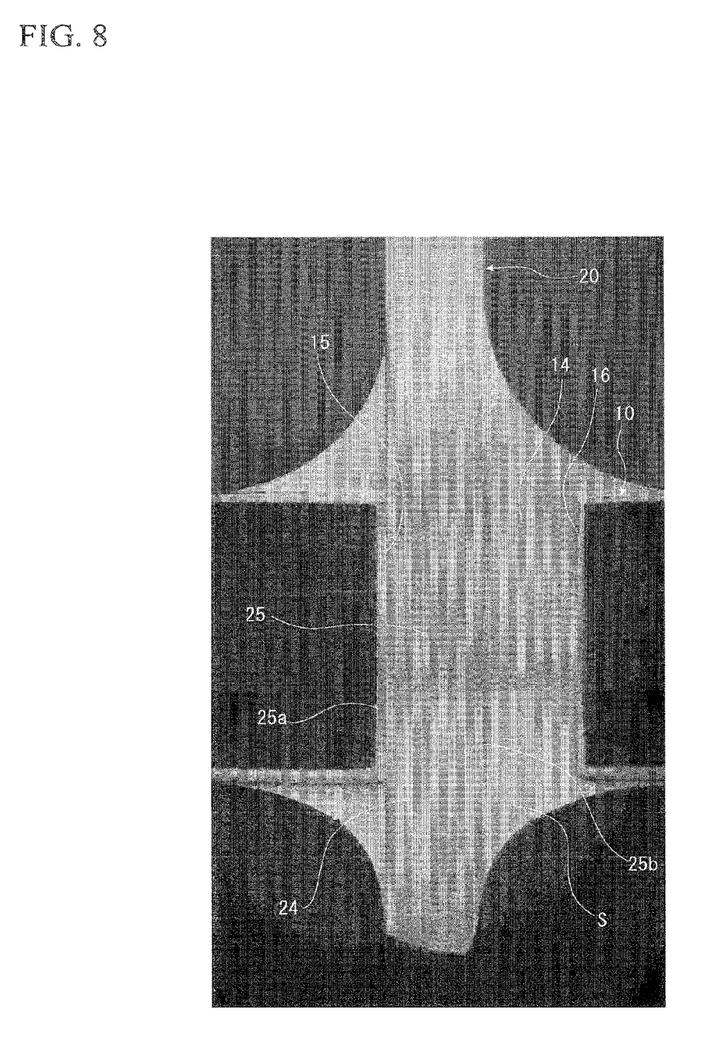
FIG. 8 is a photograph corresponding to a sectional view taken along line D-D of FIG. 5 in the state where both the printed circuit board and the terminal pin are joined to each other by soldering with the insertion portion of the terminal pin inserted into the through hole of the printed circuit board.

FIG. 5 is an enlarged photograph of the insertion portion 24 of the terminal pin 20. FIGS. 6 to 8 are photographs respectively corresponding to sectional views taken along line B-B, line C-C, and line D-D of FIG. 5 in a state where both the printed circuit board 10 and the terminal pin 20 are joined to each other by soldering with the insertion portion 24 of the terminal pin 20 inserted into the through hole 14 of the printed circuit board 10.

As illustrated in FIG. 6, the through hole 14 is formed in the shape of an oblong hole, and includes a first inner surface 15 and a second inner surface 16 opposite to each other. The first inner surface 15 and the second inner surface 16 each have a substantially flat shape. The protruding portion 26 includes: a projection surface 26b; and a recess surface 26a as a rear surface of the projection surface 26b. The first inner surface 15 and the second inner surface 16 respectively abut the base portion 25 and the protruding portion 26 of the terminal pin 20. Specifically, a first surface 25a of the base portion 25 abuts the first inner surface 15, and the projection surface 26b of the protruding portion 26 abuts the second inner surface 16. A second surface 25b of the base portion 25 faces the second inner surface 16, and is spaced apart therefrom. The recess surface 26a of the protruding portion 26 faces the first inner surface 15, and is spaced therefrom. FIGS. 6 to 8 illustrate the state after the printed circuit board 10 and the terminal pin 20 are joined to each other by solder S. Before they are joined to each other by the solder S, the first surface 25a of the base portion 25 abuts the first inner surface 15, and the projection surface 26b of the protruding portion 26 abuts the second inner surface 16, whereby the terminal pin 20 is inserted into the through hole 14 of the printed circuit board 10 and maintains its upright posture without falling down. This eliminates a special jigs for maintain the terminal pin 20 in the upright posture.

As illustrated in FIG. 7, a length L of the protruding portion 26 in the thickness direction of the printed circuit board 10 is greater than the thickness of the printed circuit board 10. In other words, the length L of the protruding portion 26 is greater than the length of the through hole 14 in the thickness direction of the printed circuit board 10. For this reason, there is an enough clearance between an edge portion 15c of the first inner surface 15 and the recess surface 26a of the protruding portion 26. Thus, the molten solder S flows into the inside of the through hole 14 through this clearance, and then joins the recess surface 26a of the protruding portion 26 to the first inner surface 15 of the through hole 14.

Figure 9:
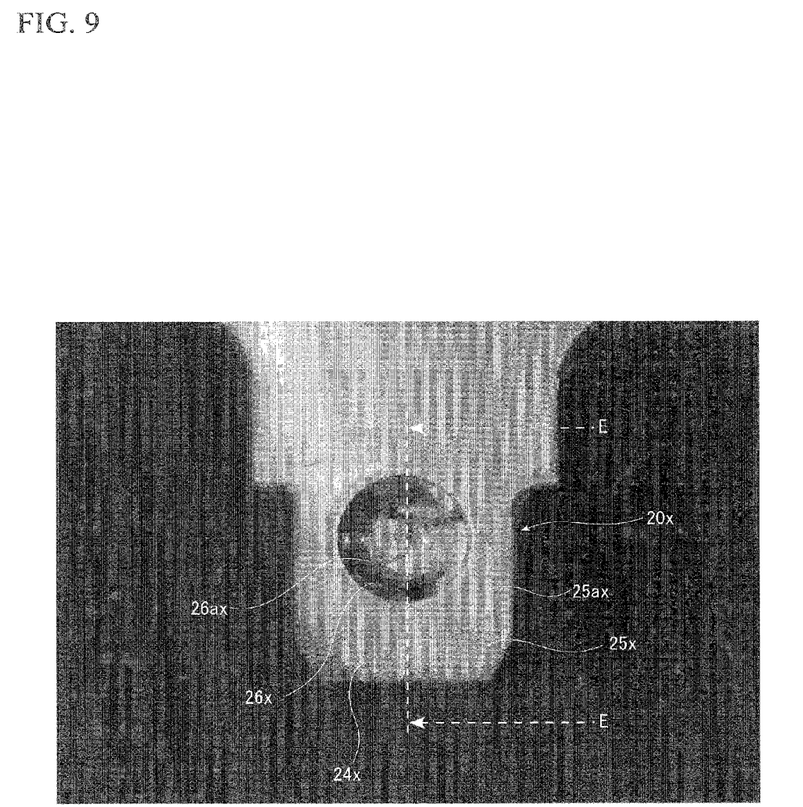
FIG. 9 is an enlarged photograph of an insertion portion of a terminal pin having a different shape from the present embodiment.
Figure 10:
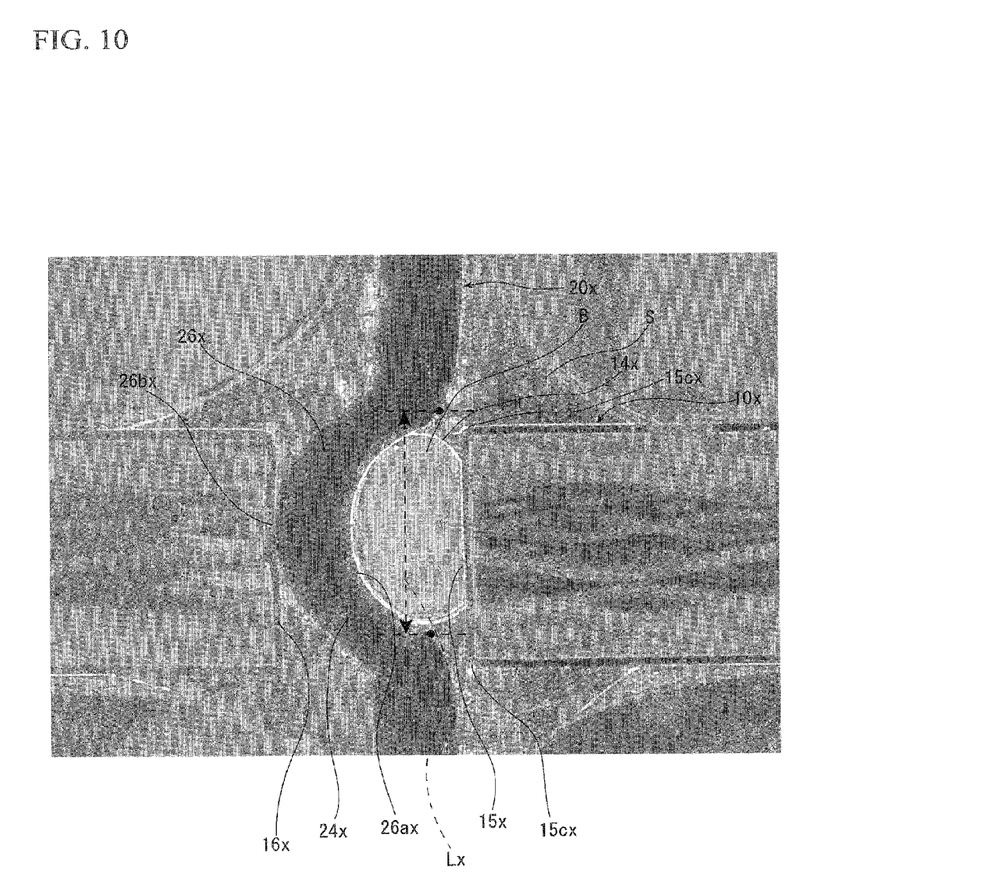
FIG. 10 is a photograph corresponding to a sectional view taken along line E-E of FIG. 9 after the terminal pin is joined to the printed circuit board by soldering.

Next, the terminal pin 20 of the present embodiment will be described as compared to a terminal pin 20x having a shape different from that of the terminal pin 20 of the present embodiment. FIG. 9 is an enlarged photograph of an insertion portion 24x of the terminal pin 20x having a shape different from that of the present embodiment. FIG. 10 is a photograph corresponding to a sectional view taken along line E-E of FIG. 9 after the terminal pin 20x is joined to a printed circuit board 10x by the solder S. As illustrated in FIG. 9, the solder S is solidified with a bubble B remaining within the solder S. This is because there is a narrow clearance between a recess surface 26ax and an edge portion 15cx of a first inner surface 15x and it is difficult for the molten solder S to flow into a through hole 14x. This problem is caused by a length Lx of a protruding portion 26x in the thickness direction of the printed circuit board 10x. As illustrated in FIG. 9, the length Lx of the protruding portion 26x is smaller than the thickness of the printed circuit board 10x. In other words, the length Lx of the protruding portion 26x is smaller than the length of the through hole 14x in the thickness direction of the printed circuit board 10x. Thus, the clearance between the insertion portion 24x and the through hole 14x is partially narrow. It is therefore difficult for the molten solder S to flow into the through hole 14x. Thus, the solder S may be solidified with the bubble B retained in the solder S as illustrated in FIG. 10. Additionally illustrated in FIG. 9 and FIG. 10 are base portion 25x, first surface 25ax, second inner surface 16x, and projection surface 26bx.

In such a case where the bubble B is retained in the solder S, the solder S may be cracked when a vibration is applied to the printed circuit board 10x or the terminal pin 20x. Further, the bubble B existing at the recess surface 26ax side in the solder S reduces a contact area between the solder S and the insertion portion 24x. This may influence the conductivity between the printed circuit board 10x and the terminal pin 20x.

However, in the terminal pin 20 of the present embodiment as illustrated in FIG. 7, the length L of the insertion portion 24 is greater than the thickness of the printed circuit board 10. It is thus possible to ensure the enough clearance between the recess surface 26a and the edge portion 15c of the first inner surface 15. Therefore, the solder S sufficiently flows into the through hole 14 to promote the release of the bubble, when the solder S applied around the through hole 14 of the printed circuit board 10 is melted.

Herein, the length L will be described. The length L corresponds to a distance from an inflection point to another inflection point, these inflection point points positioned on an edge line of the recess surface 26a when the terminal pin 20 is viewed from a plane surface including a central axis of the through hole 14. Specifically, the inflection point is a point where an angle of the edge line of the recess surface 26a with respect to the central axis of the through hole 14 is changed from/into an increase into/from a decrease.

While the exemplary embodiments of the present invention have been illustrated in detail, the present invention is not limited to the above-mentioned embodiments, and other embodiments, variations and modifications may be made without departing from the scope of the present invention.

What is claimed is:

1. A printed circuit board unit comprising:
    a printed circuit board including a through hole including first and second inner surfaces opposite to each other;

a terminal pin including an insertion portion inserted into the through hole;

solder filled into the through hole, and joining the printed circuit board with the terminal pin, wherein the insertion portion includes
- a base portion including a flat surface abutting the first inner surface, and
- a protruding portion including:
    - a projection surface projecting from the base portion to the second inner surface and abutting the second inner surface; and
    - a recess surface located at a rear side of the projection surface and spaced apart from the first inner surface, a length of the protruding portion in a thickness direction of the printed circuit board is greater than a thickness of the printed circuit board, and a deepest point of the recess surface from the flat surface in a direction perpendicular to the first inner surface of the through hole is positioned within the through hole.

2. The printed circuit board unit of claim 1, wherein the length of the protruding portion in the thickness direction corresponds to a distance from an inflection point to another inflection point, these inflection points positioned on an edge line of the recess surface when viewed from a cross section, of the recess surface, including a central axis of the through hole.

* * * * *